US009055367B2

(12) United States Patent
Li et al.

(10) Patent No.: US 9,055,367 B2
(45) Date of Patent: Jun. 9, 2015

(54) INTEGRATED PSYCHOACOUSTIC BASS ENHANCEMENT (PBE) FOR IMPROVED AUDIO

(75) Inventors: Ren Li, San Diego, CA (US); Pei Xiang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 655 days.

(21) Appl. No.: 13/326,564

(22) Filed: Dec. 15, 2011

(65) Prior Publication Data

US 2012/0259626 A1 Oct. 11, 2012

Related U.S. Application Data

(60) Provisional application No. 61/473,531, filed on Apr. 8, 2011.

(51) Int. Cl.

| | |
|---|---|
| ***H03G 5/00*** | (2006.01) |
| ***H04R 1/10*** | (2006.01) |
| ***G10L 21/0208*** | (2013.01) |

(52) U.S. Cl.

CPC .......... *H04R 1/1083* (2013.01); *H04R 2460/01* (2013.01); *G10L 21/0208* (2013.01)

USPC .......... 381/98; 381/71.1; 381/94.1; 381/94.2; 381/56; 704/226; 704/200.1

(58) Field of Classification Search

CPC .................................................... G10L 21/0208

USPC ........... 381/98, 71.1, 94.1, 94.2, 56; 704/226, 704/200.1

See application file for complete search history.

(56) References Cited

U.S. PATENT DOCUMENTS

| | | | | |
|---|---|---|---|---|
| 6,473,625 | B1 | 10/2002 | Williams et al. | |
| 2003/0198357 | A1* | 10/2003 | Schneider et al. | 381/94.2 |
| 2006/0188104 | A1 | 8/2006 | De Poortere | |
| 2007/0142942 | A1 | 6/2007 | Hyatt | |
| 2012/0020480 | A1 | 1/2012 | Visser et al. | |

FOREIGN PATENT DOCUMENTS

| | | | |
|---|---|---|---|
| JP | 2009055079 | A | 3/2009 |
| KR | 20080022131 | A | 3/2008 |
| WO | WO03015082 | A1 | 2/2003 |
| WO | WO-2010029796 | A1 | 3/2010 |

OTHER PUBLICATIONS

AARTS, "Applications of DSP for sound reproduction improvement," AES 23rd International Conference, Copenhagen, Denmark, May 23-25, 2003, pp. 1-12.

(Continued)

*Primary Examiner* — Paul S Kim

(74) *Attorney, Agent, or Firm* — Austin Rapp & Hardman

(57) ABSTRACT

Psychoacoustic Bass Enhancement (PBE) is integrated with one or more other audio processing techniques, such as active noise cancellation (ANC), and/or receive voice enhancement (RVE), leveraging each technique to achieve improved audio output. This approach can be advantageous for improving the performance of headset speakers, which often lack adequate low-frequency response to effectively support ANC.

36 Claims, 8 Drawing Sheets

(56) References Cited

OTHER PUBLICATIONS

Gan, et al., "Integration of virtual bass reproduction in active noise control headsets," 2004 7th International Conference on Signal Processing Proceedings. ICSP'04, vol. 1, Aug. 31-Sep. 4, 2004, pp. 368-371.

International Search Report and Written Opinion—PCT/US2012/026992—ISA/EPO—Jun. 6, 2012.

Wang L., et al., "Bass enhancement for automobile multimedia system using active noise equalizer", Consumer Electronics, 2005. (ISCE 2005). Proceedings of the Ninth International Symposium on MACAU SAR June 14-16, 2005, Piscataway, NJ, USA, IEEE, Jun. 14, 2005, pp. 247-252, XP010832153, DOI: 10.1109/ISCE.2005.1502379 ISBN: 978-0/7803-8920-5 p. 249, paragraph III. Proposed System figs. 3, 4.

* cited by examiner

INTEGRATED PSYCHOACOUSTIC BASS ENHANCEMENT (PBE) FOR IMPROVED AUDIO

CLAIM OF PRIORITY UNDER 35 U.S.C. §119

The present Application for Patent claims priority to Provisional Application No. 61/473,531, filed Apr. 8, 2011, and assigned to the assignee hereof and hereby expressly incorporated by reference herein.

FIELD

The present disclosure relates generally to audio systems, and more specifically, to improving the low-frequency performance of audio systems.

BACKGROUND

Background

There is a class of audio speakers, commonly used in earphones and handsets, that have relatively poor performance at low frequencies (e.g., <800 Hz). To improve the performance of such speakers, psychoacoustic bass enhancement (PBE) has been used. Certain PBE techniques are known, and generally, these methods are based on the residue pitch theory to generate mid-frequency harmonics in lieu of low-frequency components. These harmonics cause a residue pitch phenomenon when heard by the listener, which creates the illusion that the missing low-frequency components do exist. Thus, with PBE, the listener perceives low-frequency components that are not actually reproduced because they are below the frequency levels that the speaker can reproduce. This auditory trick works because of the nature of the human auditory system.

It is known to combine PBE techniques with active noise cancellation (ANC) in headsets to improve perceived bass reproduction and low-frequency noise attenuation. An example of this combination is described in the article "Integration of Virtual Bass Reproduction in Active Noise Control Headsets," by Woon-Seng Gan; Kuo, S. M., Signal Processing, 2004. Proceedings. ICSP '04. ANC is a technique to perform noise suppression through the production of acoustic waves equal in amplitude, but 180° out of phase relative to the target noise being suppressed. ANC is often used for near-end noise cancellation applications. This generated anti-noise cancels out the background noise through destructive interference.

Generally, it can be problematic to perform ANC with small speakers, such as headset speakers, using known ANC techniques because ANC typically relies on bulky audio speakers with good low frequency response, which are not useable with earphone headsets and mobile handsets. ANC performance is highly affected by acoustic components, especially the low-frequency response characteristics of the speaker. Some known handset speakers lack adequate low-frequency response due to the size limit of the speaker. This results in suboptimal near-end noise cancellation when using ANC. Moreover, known techniques of combining PBE and ANC in headset speakers, such as those described in Woon-Seng Gan et al., do not fully integrate the operation of the PBE and ANC methods, which may also result in suboptimal performance. For example, in Woon-Seng Gan's disclosed system, feedback from the ANC process is not provided to the PBE process so as to optimize overall system performance.

SUMMARY

The techniques disclosed herein overcome many of the limitations of prior attempts to effectively integrate PBE into audio reproduction systems. According to an aspect of these techniques, an improved apparatus includes an active noise cancellation (ANC) module and a psychoacoustic bass enhancement (PBE) module configured to produce a PBE signal, which may include virtual bass, based on output from the ANC module.

According to another aspect, an apparatus includes means for receiving the audio signal and means for performing PBE on the audio signal, based on output from an ANC module.

According to another aspect, a computer-readable medium, embodying a set of instructions executable by one or more processors, includes programming code for receiving the audio signal and programming code for performing PBE on the audio signal, based on output from an ANC module.

According to a further aspect, a method of processing an audio signal includes receiving the audio signal and performing PBE on the audio signal, based on output from an ANC module.

Other aspects, features, and advantages will be or will become apparent to one with skill in the art upon examination of the following figures and detailed description. It is intended that all such additional features, aspects, and advantages be included within this description and be protected by the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the techniques and devices described herein. In the figures, like reference numerals designate corresponding parts throughout the different views.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The word “exemplary” is used throughout this disclosure to mean “serving as an example, instance, or illustration.” Anything described herein as “exemplary” is not necessarily to be construed as preferred or advantageous over other approaches or features. Unless expressly limited by its context, the term “signal” is used herein to indicate any of its ordinary meanings, including a state of a memory location (or set of memory locations) as expressed on a wire, bus, or other transmission medium.

The techniques described herein integrate methods and control designs between audio modules of active noise cancellation (ANC, also called active noise reduction), psychoacoustic bass enhancement (PBE), audio processing, and/or receive voice enhancement (RVE), leveraging each module’s parameters and tuning flexibility, to achieve improved audio performance.

With these techniques, PBE converts part of the real bass content of incoming audio that is needed for ANC and/or RVE into virtual bass, so that the physical burden on less ideal speakers is offloaded, and speaker saturation/distortion is reduced. What is more, tuning parameters between the ANC, PBE, RVE and/or audio post-processing modules can be linked together, so that PBE is available to enhance the performance of the ANC and RVE processes, and the tuning parameters of each process can be updated in real-time, according to different audio signal contents.

In general, in systems where adequately reproducing low-frequency audio may be a challenge, PBE can be integrated to improve the perceived low-frequency performance. The integration of PBE can be extended to any situation where the audio speaker has limited ability to physically reproduce enough to low-frequency sound. This integration may result in improved performance of other audio processing algorithms and overall system performance. PBE can be applied, with its tuning parameter linked to other audio processing method tuning parameters, or retuned according to the other audio processing output signals and/or system performance when they are fed back to the PBE module/process.

Figure 1:
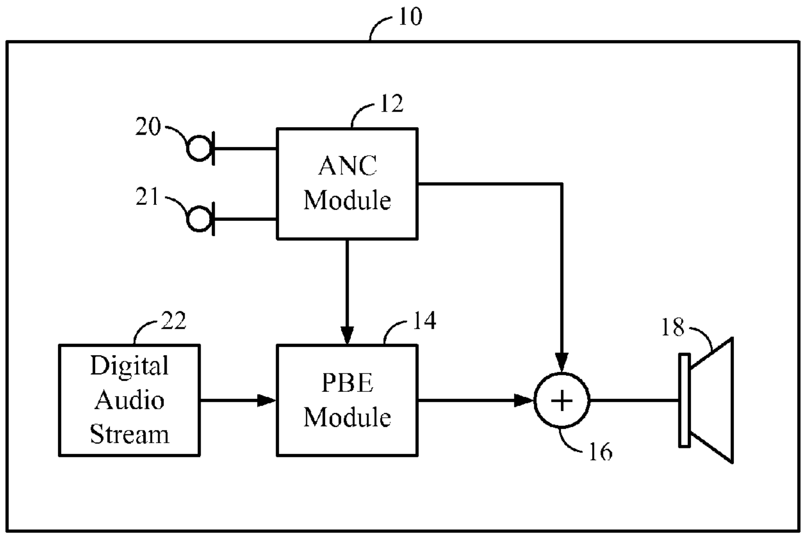
FIG. 1 is a block diagram illustrating an exemplary audio system integrating PBE and ANC processing.

FIG. 1 is a block diagram illustrating an exemplary audio system 10 integrating a psychoacoustic bass enhancement (PBE) module 14 and an active noise cancellation (ANC) module 12. The system 10 also includes at least one reference microphone 20, one or more microphones for receiving near-end audio energy, such as voice input, a digital audio stream source 22, a combiner 16 and at least one speaker 18. The system 10 can be included in any suitable audio output system, including a computer, gaming console, stereo system, or handheld device such as a cellular phone, personal digital assistant (PDA), smart phone, headset, MP3 player, or the like. The predominate functions of the ANC module 12, PBE module 14 and combiner 16, which are described herein, may be implemented in the digital processing domain, analog domain, or any suitable combination of analog and digital electronic components.

During operation of the system 10, the PBE module 14 selectively applies PBE to an input audio signal representing the digital audio stream 22 during playback to offload bass stress due to the added ANC anti-noise bass content produced by the ANC module 12. When the ANC module 12 is activated, the speaker 18 cancels out the ambient noise by reproducing 180° out-of-phase anti-noise. The anti-noise is generally in the low-frequency range of the audio signal. This anti-noise bass component is added on top of whatever music, voice, or other audio content is in the digital audio stream 22, which is ultimately played through the speaker 18. When the ambient noise detected by the reference microphone 20 has significant low frequencies, e.g., airplane noise, the anti-noise signal from the ANC module 12 combined together with the audio signal low frequencies in the digital audio stream 22, e.g., drum kicks and double bass tunes, the combination can easily saturate the speaker 18, causing distortion. In this situation, to reduce distortion the PBE module 14 can shift the bass components of the digital audio stream 22 to higher frequency regions by reproducing harmonics to leave more bass headroom for the low-frequency ANC signal to work.

As input, the ANC module 12 receives signals from the microphones 20-21 and in response, outputs an ANC signal, which is received by the combiner 16. The ANC signal represents the anti-noise signal (waveform) generated by the ANC module 12. The ANC module 12 can also receive control signals from the PBE module 14 as control input.

The ANC output signal may also be provided to the PBE module 14, in order to control and adjust PBE parameters during operation of the system 10. The parameter adjustments may take place in real-time. In addition to the ANC output signal, other signals from the ANC module 12 can be provided to the PBE module 14 for control purposes. These signals from the ANC module 12 can provide the status of the ANC module 12 to the PBE module 14 so that the PBE module 14 can adjust the PBE parameters. The status of the ANC module 12 can include the on/off state of the ANC module 12, the energy level of the ANC output signal, the spectrum content of the ANC output signal or the like. Additionally/alternatively, ANC coefficients, such as filter coefficients, e.g., IIR filter coefficients, may be provided to the PBE module 14 for control purposes.

The ANC module 12 may selectively activate itself, depending on the ambient noise level, or may be activated by external controls. The ANC module 12 is configured to actively reduce ambient acoustic noise by generating a waveform that is an inverse form of the noise wave (e.g., having the same energy level and an inverted phase, i.e., 180° out of phase), also called an “anti-phase” or “anti-noise” waveform. The ANC module 12 generally uses one or more microphones, such as microphones 20-21, to pick up an external noise reference signal representing the ambient noise level, generates an anti-noise waveform from the noise reference signal, and the system 10 then reproduces the anti-noise waveform through one or more loudspeakers, such as speaker 18. This anti-noise waveform interferes destructively with the original, ambient noise wave to reduce the level of the noise that reaches the ears of the listener.

Suitable ANC methods are known to those skilled in the art. The ANC module 12 can implement one or more of these ANC methods to achieve its functions described herein.

ANC performance is highly affected by acoustic transducers, e.g., speakers, especially the low-frequency response characteristics of the speaker. Commonly used handset speakers often lack sufficient low-frequency response due to the size limitations of the speaker. This results in suboptimal near-end ANC. Existing solutions typically require the use of bulky and expensive speakers that have good low-frequency characteristics to achieve the desired noise cancellation performance.

The ANC module 12 can be calibrated with an ideal full-range speaker and retain its tuning unchanged during operation of the system 10.

A high pass filter (not shown) can be included between the ANC module 12 and combiner 16 to filter the ANC output signal of the ANC module 12.

The PBE module 14 selectively synthesizes the virtual “missing fundamental frequency” with its higher harmonics, to psycho-acoustically achieve an enhanced bass sensation to the listener. Details of an exemplary implementation of the PBE module 14 are discussed herein below in connection with FIG. 3. The PBE module 14 receives the audio signal from the digital audio stream 22 and in response outputs a PBE signal to the combiner 16. When the PBE module 14 is active, the PBE signal represents a psycho-acoustically enhanced audio signal. When the PBE module 14 is not active, the PBE signal represents the incoming audio signal from the digital audio stream 22.

The PBE module 14 is an audio post-processing module, but its function is not just that of traditional bass boost. Generally, when the ANC module 12 is enabled in the system 10, the real bass frequency content in the audio signal from the digital audio stream 22 is replaced with PBE-generated harmonics to reduce distortion, including nonlinear distortion, of the speaker 18. The speaker 18 may have a non-ideal frequency response (i.e., poor low-frequency response). The PBE module 14 can use programmable parameters. As discussed above, these parameters can be a function of the ANC module status, which can be determined from the ANC output signal and/or other control signals from the ANC module 12. For example, a PBE parameter that can be adjusted based on the ANC module signal(s) is the PBE module crossover cut-off-frequency. This parameter can be changed so that less real bass content is sent to the speaker 18, and instead, more virtual bass is generated by the PBE module 14 and sent to the speaker 18, while ANC module 12 is turned on.

The digital audio stream 22 is digitized audio in any suitable format, including but not limited to PCM, WAV, MP3, MPEG and the like. The digitized audio can include any type of audio content, such as music, voice, noise, combinations of the foregoing, and the like. The digitized audio can be stored in the system 10 and/or received from external sources, such as a remote server or a user microphone.

The combiner 16 mixes the PBE signal from the PBE module 14 together with the ANC output signal (which generally is a low-frequency audio signal). The combiner 16 may include a digital summing circuit for adding together a digital ANC output signal and a digital PBE output signal. Alternative mixers, such as an analog audio mixer, may be used in other configurations of the systems disclosed herein, including the system 10 of FIG. 1.

The speaker 18 is any suitable audio transducer for reproducing sound from electrical signals, including relatively small speakers such as those used in handheld devices such a cell phones, PDAs and the like. Although not shown in FIGS. 1 to simplify the drawing, a digital-to-analog converter (DAC) and other analog audio processing circuits such as amplifiers, filters and the like can be included is the audio signal path between the combiner 16 and speaker 18.

In an exemplary operational scenario of the systems described herein, including the system 10 of FIG. 1, when there is considerable wideband rumble in the low frequencies of the ambient noise, the PBE module 14 (or a control module) may adjust the bass cutoff-frequency of the PBE module 14 to a higher frequency, to leave more spectrum available in the bass frequencies for the ANC output signal.

In another exemplary operational scenario of the systems described herein, including the system 10 of FIG. 1, when there is not much low frequency energy in the digital audio stream audio signal, the PBE module 14 can be turned off and the PBE signal represents only the incoming audio signal without any PBE modification, since the anti-noise waveform from ANC module 12 is not being added on top of much bass energy in the incoming audio signal.

In another exemplary operational scenario of the systems described herein, including the system 10 of FIG. 1, when there is significant bass frequency energy in the incoming audio signal from the digital audio stream 22, but the low frequencies in the ambient noise are relatively quiet, the PBE module 14 can be adjusted to create less virtual bass, i.e., reduced PBE, since there is not much additional energy in the low frequencies added by the anti-noise signal from the ANC module 12.

The operations of the systems disclosed herein are not limited to the foregoing exemplary scenario described above. Other operational scenarios and configurations are possible.

Figure 2:
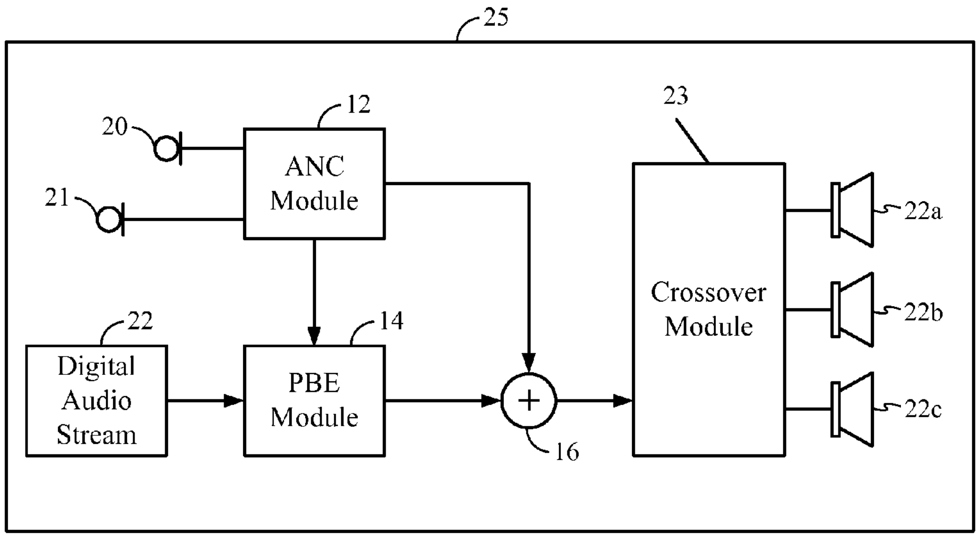
FIG. 2 is a block diagram illustrating an exemplary multi-speaker audio system integrating PBE and ANC processing.

FIG. 2 is a block diagram illustrating an exemplary multi-speaker audio system 25 integrating the PBE module 14 and ANC module 12. The system 25 also includes a crossover module 23 and a plurality of speakers 22*a-c*. The techniques and systems disclosed herein also work with multiple speakers, as illustrated in FIG. 2, if the crossover module 23 of multiple speakers is placed after the summation node (combiner 16) of the ANC and PBE outputs, as illustrated in FIG. 2.

The crossover module 23 can perform a conventional audio crossover function, i.e., separating the output audio signal, in this case output from combiner 16, into different frequency bands so that each frequency band can be played back on a respective speaker 22*a-c*. The crossover module 23 may include one or more audio filters for accomplishing this function, such as bandpass filters. Each speaker 22*a-c* can be specifically selected to have performance characteristics suitable for the output frequency band that it is to reproduce, for example, a woofer speaker can receive low-frequency output from the crossover module 23, a mid-range speaker can receive mid-frequency output, and a tweeter speaker can receive high-frequency output. Other arrangements and frequency responses of the speakers 22*a-c* are possible.

The crossover module 23 can be implemented in either the analog or digital domain.

The speakers 22*a-c* are any suitable audio transducers for reproducing sound from electrical signals, including but not limited to relatively small speakers such as those used in handheld devices such a cell phones, PDAs and the like. Although not shown in FIG. 2, a DAC and/or other analog audio processing circuits such as amplifiers, filters and the like can be included is the audio signal path from the combiner 16 to the speakers 22*a-c*. If the crossover module 23 is implemented as a digital component, the DAC and analog audio circuits can be placed in the audio path between the crossover module 23 and speakers 22*a-c;* otherwise, the DAC can be placed in the audio path between the combiner output and the crossover module input and the and analog audio circuits can be place in the audio path either before or after the crossover module 23.

Although not shown in the other figures, the crossover module 23 and multiple speakers 22*a-c* can be included in the other systems disclosed herein, as an alternative configuration.

Figure 3:
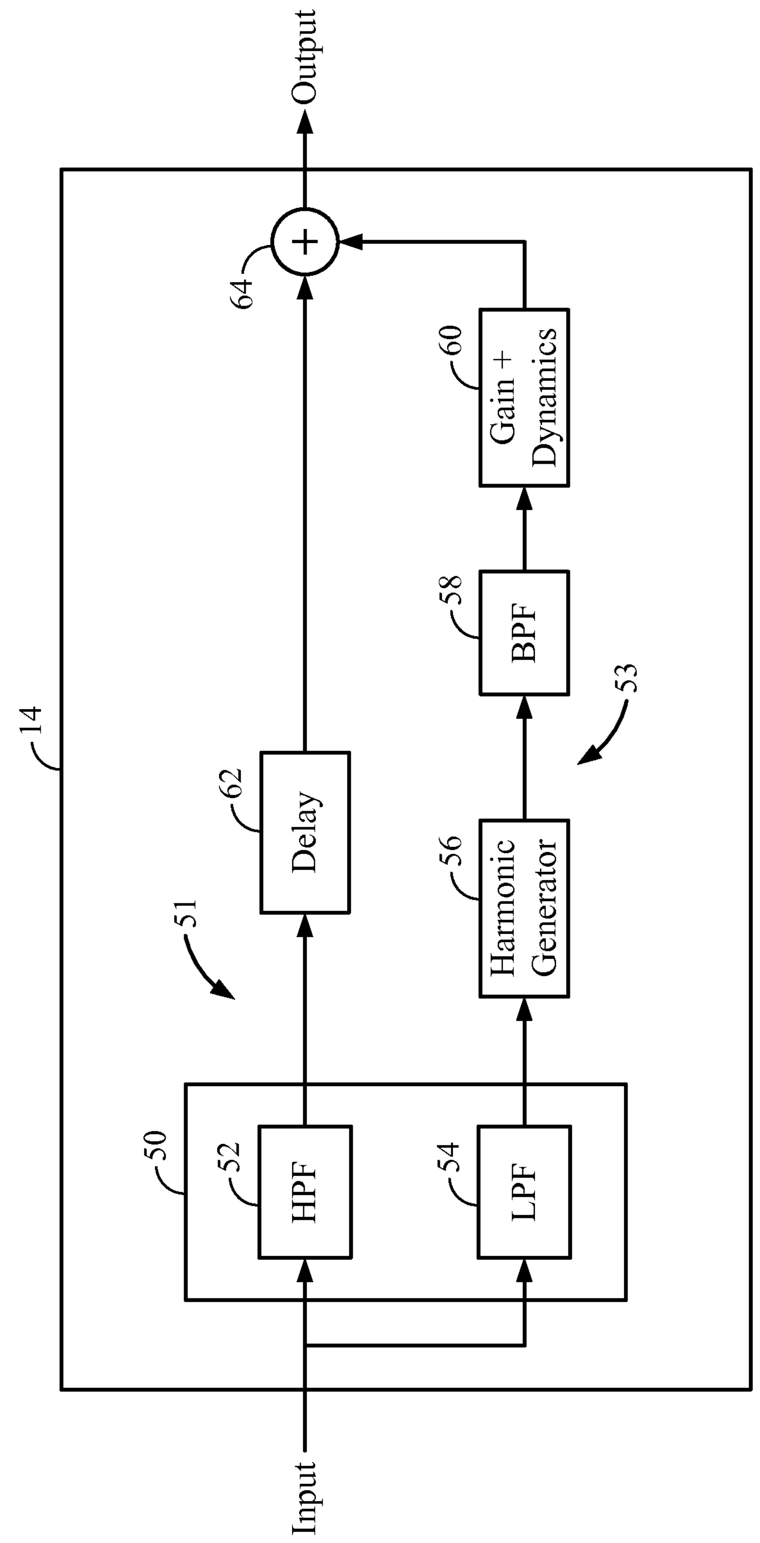
FIG. 3 is a block diagram illustrating certain details of the PBE module shown in FIGS. 1-2.

FIG. 3 is a block diagram illustrating certain details of the PBE module 14 shown in FIGS. 1-2. The PBE module 14 includes crossover filters 50, which include a high pass filter (HPF) 52 and a low-pass filter (LPF) 54, a delay 62, a harmonic generation module 56, a band pass filter (BPF) 58, a gain and dynamics (G&D) module 60 and a combiner 64.

The crossover filters 50 separate the incoming audio signal into two processing paths: a high-frequency path 51 and a low-frequency path 53. The high-frequency path 51 results from the HPF 52, and the low-frequency path 53 results from the LPF 54.

As illustrated in FIG. 3, the bass contents of audio input are extracted by the LPF 54. Based on the bass content signal output from the LPF 54, harmonics of it can be generated by the harmonic generation module 56, making the bass "virtual."

The harmonic generation module 56 generates harmonics using the output of the LPF 54. The generated harmonics create a "residue pitch" or "missing fundamental" effect when perceived by the listener. These harmonics are generated in such a way that the perceived pitch is the same as the original low frequency signal.

Harmonic generation methods employed by the module 56 may include non-linear processing or a frequency tracking method.

Non-linear processing is simpler to design and implement than frequency tracking algorithms, but may include distortion as a byproduct. Suitable non-linear processing techniques are known in the art and include full-wave rectification, half-wave rectification, integration, clipper, and the like.

Available frequency tracking methods are more complicated, but provide more control on the exact harmonics that are generated by the module 56. Frequency tracking methods can take different forms, as is known in the art. When applied to PBE, the frequency tracking method tracks the main frequency (tone) components in the bass components of the audio signal output from the LPF 54 in each frame of digitized audio, and according to the spectrum of the bass components, the method synthesizes the harmonics to substitute for the tone components themselves.

The harmonics output from the harmonic generation module 56 are band pass filtered by BPF 58, which filters out the low frequency inter-modulation components that result from the nonlinear operation in harmonics generation. The BPF 58 can also attenuate the high-order harmonics that may introduce distortions. The output of the BPF 58 is then provided to the G&D module 60, which applies gain and audio dynamic range control processing to the filtered harmonics.

The G&D module 60 can perform loudness matching between the original low frequency components and the generated harmonics to give the same loudness dynamic. The level of the harmonics may be compressed or expanded according to the sound pressure level (SPL). Overall, the gain of virtual bass can be adjustable compared to non-virtual bass and non-bass components. A smoothing function may also be used to smooth out any abrupt changes in gain, so as to prevent "clicking" sound from occurring at the output of the PBE module 14.

The dynamic range of the generated virtual bass can also be adjusted by the G&D module 60. The G&D module 60 can heavily compress the virtual bass output of the harmonics generation module 56 with compensation gain to achieve a loud bass sound. The G&D module 60 can also monitor the level envelope of the original bass component output from the LPF 54 and try to match or partially match the generated virtual bass envelope to it. The G&D module 60 can also filter the virtual bass signal. A flat spectrum of generated harmonics from the non-linear processing of the harmonics generation module 56 can sound very harsh and unnatural in some instances. In such cases, the G&D module 60 can filter out the higher frequencies and just preserve relatively lower frequencies. This can minimize the unnatural sound of the virtual bass while maintaining the virtualized low frequency sensation. All of the above filtering, gain and other dynamic parameters of the G&D module 60 can be tuned and adjusted for certain applications of the systems and methods disclosed herein.

The output of the gain and dynamics module 60 is then combined with the processed non-bass components of the input audio signal from the high-frequency path 51 to produce the PBE module output. The combining is performed by the combiner 64.

The HPF 52 extracts the non-bass components of the input audio signal. Since the additional processing of the bass components requires more time, the non-bass components output from the HPF 52 are delayed by the delay 62 prior to being recombined with the processed bass components at the combiner 64, and then output by the module 14. A suitable time delay is provided by the delay 62 to time-align the high-frequency and low-frequency paths 51, 53.

In general, the following parameters of the PBE module 14 are tunable:

1. Bass cutoff frequency: this is the frequency below which the incoming audio signal contents are treated as bass and thus processed by the low-frequency path 53 of the PBE module 14, which substitutes the bass components with higher harmonics, partially or entirely. The bass cutoff frequency sets both the LPF and HPF cutoff frequencies of the LPF 54 and HPF 52, respectively, of the crossover filters 50, and also sets the bandpass frequency window of the BPF 58.

2. Crossover filter orders: decides how sharp the roll off of the LPF 54 and HPF 52 that separate bass contents and the higher frequency components. In principle, the sharper the filter roll off, the better. But lower order filters are in general easier to implement. The components in PBE module 14 affected by this parameter are the HPF 52, LPF 54, and BPF 58.

3. Harmonic control parameters: these parameter control the settings of the harmonic generation module 56 and G&D module 60. The parameters can include the number of generated harmonics and/or the envelope shape of generated harmonics. The parameters can also set the relatively number of even/odd harmonics in composition of the virtual bass.

4. Audio dynamics parameters: these parameters primarily affect the operation of the G&D module 60. The parameters control the dynamic behaviors. The audio dynamics parameter can be on either the low-frequency path 53 or the high-frequency path 51. The parameters may include any volume and loudness matching settings, and also the limiter/compressor/expander settings such as threshold, ratio, attack/release time, makeup gain, and the like. These dynamic range control (DRC) parameters shape the loudness and dynamic range behaviors of an audio signal.

5. Non-bass content delay: This parameter sets a constant delay of the non-bass contents along the high-frequency path 51, in order to match the processing delays caused by virtual bass generation along the low-frequency path 53. The PBE component affected by this parameter is the Delay 62.

The PBE module 14 and its components may be implemented in the digital domain using software executing on a processor such as a digital signal processor (DSP). Alternatively, the PBE module 14 can be partially or entirely analog depending on implementation, so the digital/analog choice on these parameters depends upon the implementation of the PBE module 14. Other PBE system parameters, other than those disclosed above, may also be dynamically tuned.

The foregoing PBE parameters can be adjusted or tuned in real-time during operation based on the configuration, statuses, and/or operating conditions of the other audio processing components, e.g., ANC module, RVE module, audio post-processing module and the like, included in the audio system. These parameters can be digital values stored and set by a controller included in the audio system.

The combiner 64 mixes the signals from the low-frequency path 53 and signals from the high-frequency path 51. The combiner 64 may include a digital summing circuit for adding together a digital audio output from the delay 62 and a digital audio output from the G&D module 60. Alternative mixers, such as an analog audio mixer, may be used in other configurations of the PBE module 14.

An additional, optional G&D module may be included in the high-frequency path 51 after the delay 62 and before the combiner 64.

Figure 4:
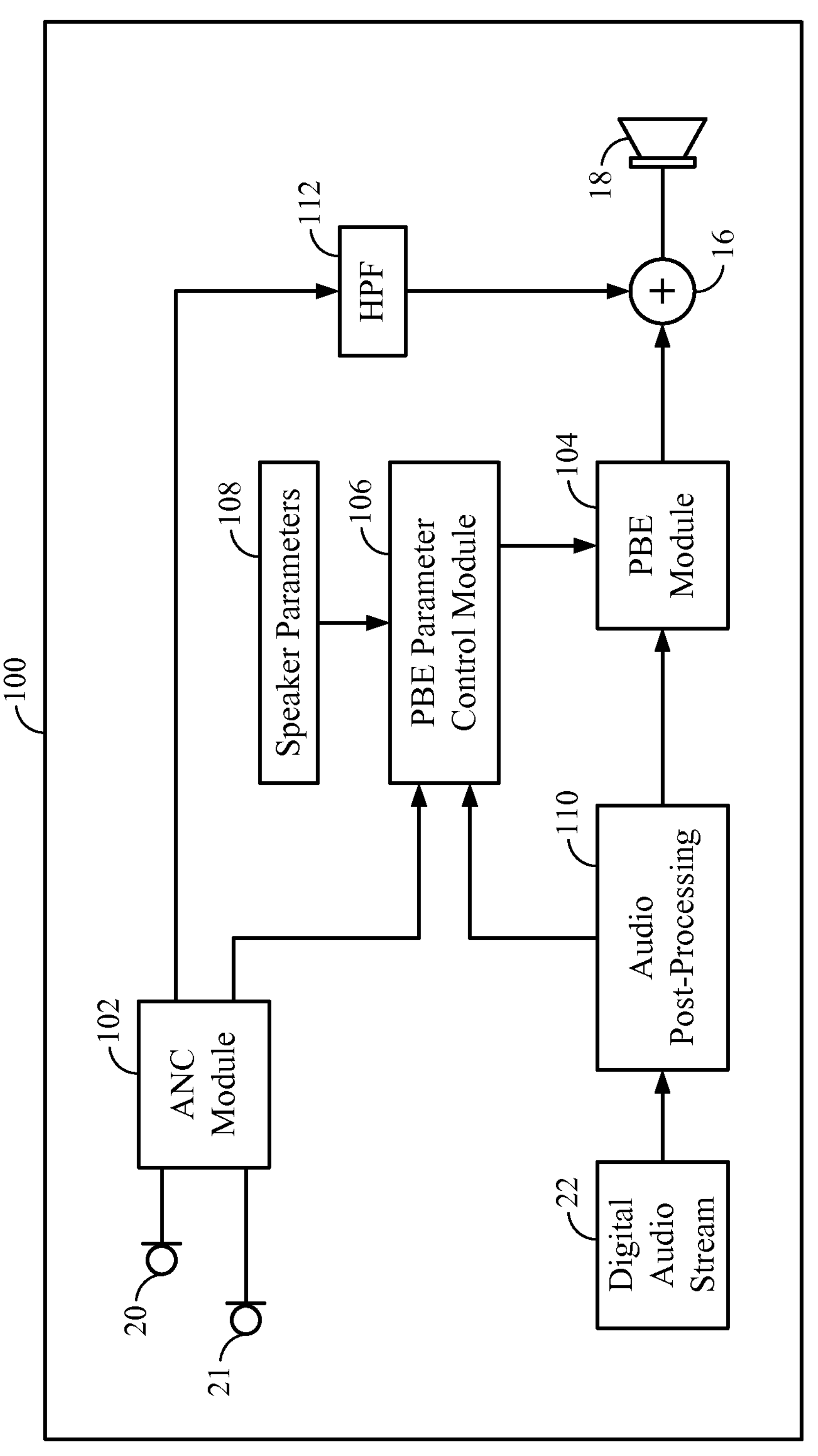
FIG. 4 is a block diagram illustrating an exemplary audio system integrating PBE, audio post-processing and ANC processing.

FIG. 4 is a block diagram illustrating an exemplary audio system 100 integrating a PBE module 104, an audio post-processing module 110 and an ANC module 102. The system 100 also includes the reference microphone 20, the near-end microphone 21, digital audio stream 22, a PBE parameter control module 106, an optional high pass filter (HPF) 112, the combiner 16 and at least one speaker 18. Speaker parameters 108 may also be stored in or provided to the system 100 as predefined digital data fields. The speaker parameters 108 are made available to the PBE parameter control module 106. The speaker parameters 108 may include speaker specifications and profiles of the speaker 18, such as a frequency response profile, sensitivity, maximum SPL, rated power, drive characteristics or the like.

The ANC module 102 can include those functions of the ANC module 12 described in connection with FIGS. 1-2, and the PBE module 104 can include the functions and components of the PBE module 14 described in connection with FIGS. 1-3.

In real-time, the ANC module 102 and the audio post-processing module 110 provide their signal output to the PBE parameter control module 106, which constantly monitors the signals and decides the relative energy between anti-noise and the audio contents of the audio signal from the digital audio stream 22. This information is used to tune parameters (such as those discussed above in connection with FIG. 3) of the PBE module 104 over time and in some configurations, in real-time. The control parameter signal output from the PBE parameter control module 106 to the PBE module 104 can be at a slow control rate instead of an audio signal rate. In addition, the speaker parameters 108, along with the signals from the ANC and audio post-processing modules 102, 110, may be used to tune the PBE module parameters.

The audio post-processing module 110 performs audio processing methods on the digital audio stream signal that apply effects like low-pass filtering (LPF), equalization (EQ), multi-band dynamic range control (MBDRC) and the like to the incoming audio signal from the audio stream 22. The equalization filters and multi-band dynamic controllers of the audio post-processing module 110 may also boost the low-frequency signal level and limit the audio amplifier power. Thus, these effects may increase bass content of the audio signal, which can saturate the speaker 18 and cause distortions to the speaker audio output.

When coexisting with the ANC and audio post-processing modules 102, 110, the PBE control module 106 can observe how much real bass content they are adding to the audio signal from the digital audio stream 22, and then adjust the PBE module's internal dynamic range control, so that a dynamic control of the non-virtual bass region of the audio signal is achieved with the PBE module 104, further avoiding signal low-frequency saturation of the speaker 18. For example, the PBE parameter control module 106 may adjust the dynamic compression of the PBE module 104 (the G&D module compressor parameters) in real-time, based on signal inputs from the ANC and audio post-processing modules 102, 110, so that the bass energy of the PBE output signal from the PBE module 104 stays more constant, to avoid occasional speaker distortions caused by dynamic changes in the bass content added by the other modules 102 and 110.

Figure 5:
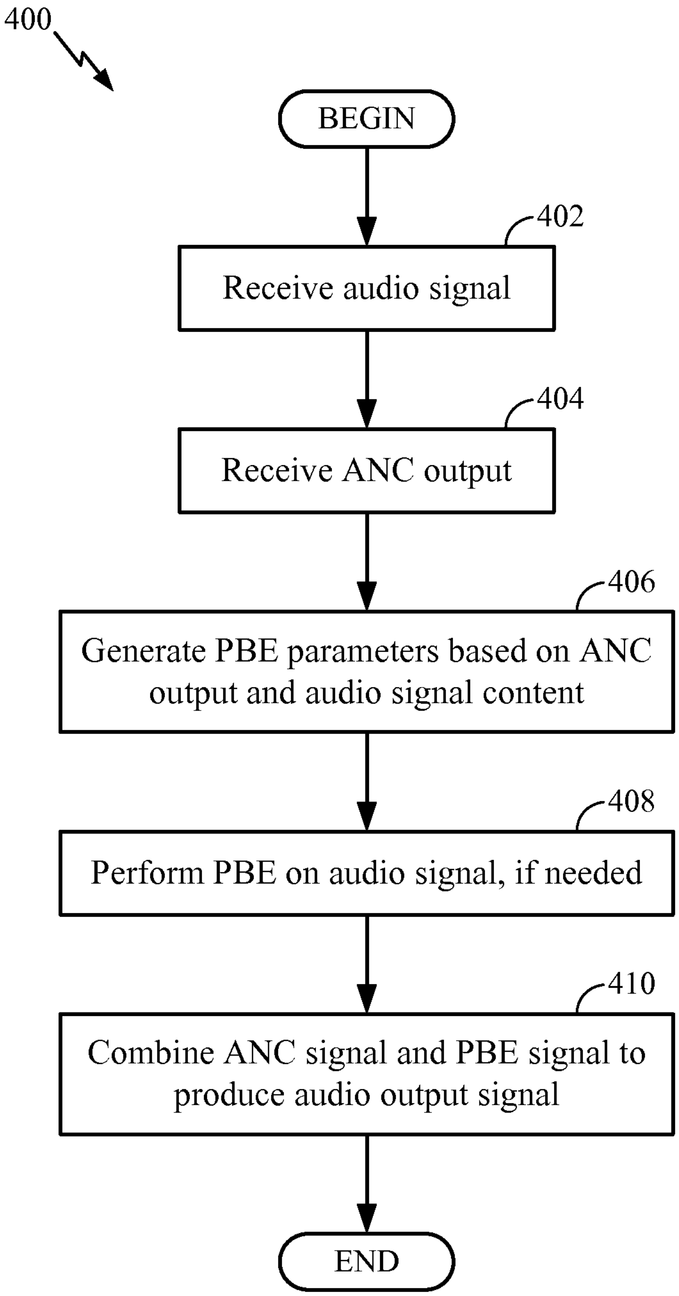
FIG. 5 is a flowchart showing an example method of operating the system of FIG. 4.

FIG. 5 is a flowchart 400 showing an example method of operating the system 100 of FIG. 4. In step 402, an audio signal is received by the system 100. The audio signal may be the audio signal of the digital audio stream 22. The audio signal may undergo post-processing by the audio post-processing module 110. The post-processing module 110 determines characteristics of the audio content, such as the frequency spectrum of the audio signal, its relative and/or absolute bass energy, or the like. The characteristics of the audio content, after audio post-processing is performed, if any, are provided to the PBE parameter control module 106. In addition, the PBE parameter control module 106 also receives output from the ANC module 102 (step 404). The ANC output may include the ANC signal itself, ANC module status, and/or other control signals.

In step 406, the PBE parameter control module 106 generates PBE parameters based on the ANC output and audio signal content. The PBE parameters produced by the module 106 may include updated parameters, or alternatively, initial default parameters, depending on the operational state of the system 100. The control module 106 sets the PBE parameters of the PBE module 104 in real-time, and may do so at predefined intervals. The PBE parameters determined by the PBE parameter control module 106 may include all of those discussed herein, including those described above in connection with FIG. 3.

In step 408, PBE is performed on the audio signal output from the post-processing module 110 by the PBE module 104, if it is determined by the control module 106 that PBE of the incoming audio is needed. Whether or not PBE is performed is based on the ANC module status and/or output signal and the bass content of the audio signal output from the audio post-processing module 110. Generally, the PBE module 104 is controlled to achieve optimal performance of the speaker 18.

In step 410, the ANC signal output from the ANC module 102 and the PBE signal output from the PBE module 104 are combined by combiner 16 to produce the audio output signal. The audio output signal can then be processed further, for example, by D/A conversion, and analog processing, such as amplification, filtering or the like, before it is converted to sound by the speaker 18.

In some configurations of the system 10, 25 and 100 of FIGS. 1-2 and 4, the ANC module runs in a codec chip in a PDM high-clock rate domain, and the PBE module runs in a separate DSP or application processor having a different clock rate. The ANC status and output signals can be provided to the DSP periodically to provide necessary anti-noise information to the PBE control module. Also, speaker profile and specifications (e.g., speaker parameters 108) can also be provided to the PBE control module, so that more accurate filter roll-offs and cutoff frequencies in the PBE module can be used as reference for PBE tuning.

Figure 6:
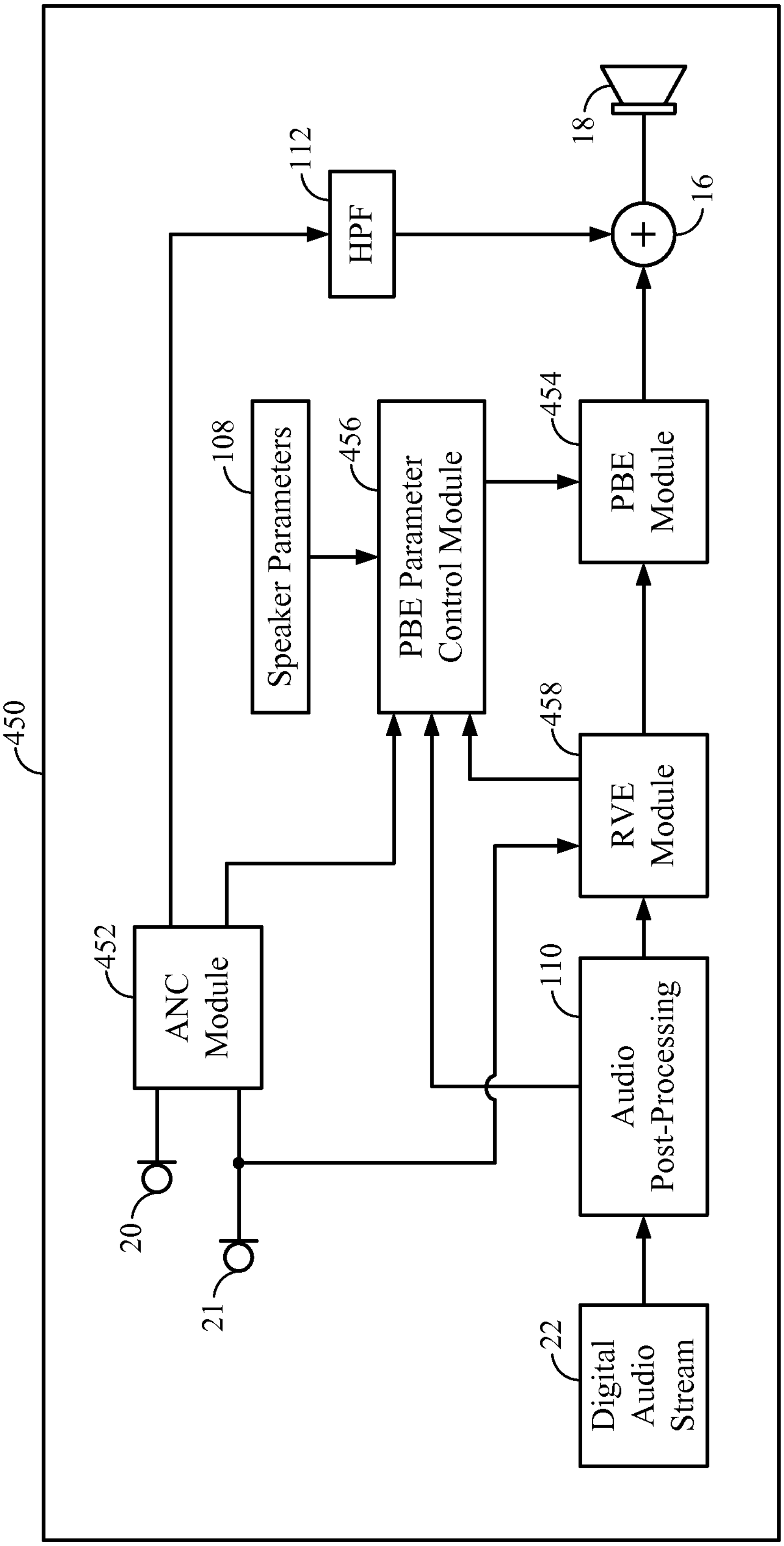
FIG. 6 is a block diagram illustrating an exemplary audio system integrating ANC, audio post-processing, PBE and RVE.

FIG. 6 is a block diagram illustrating an exemplary audio system 450 integrating an ANC module 452, the audio post-processing module 110, a PBE module 454, and a receive voice enhancement (RVE) module 458. The audio system 450 also includes the reference microphone 20 and near-end microphone 21, the digital audio stream 22, the optional HPF 112, the combiner 16, at least one speaker 18, and a PBE parameter control module 456 for tuning the PBE module 454. Speaker parameters 108 may also be stored in or provided to the system 100. The speaker parameters 108 are made available to the PBE parameter control module 456.

The ANC module 452 can include those functions of the ANC module 12 described in connection with FIGS. 1-2, and the PBE module 454 can include the functions and components of the PBE module 14 described in connection with FIGS. 1-3.

The system 450 applies PBE on audio that is first processed by the RVE module 458. This results in better masking of low-frequency ambient noise. RVE works by selectively applying gains to the received audio signal (from the digital audio stream 22) based on the near-end noise level and frequency composition (for example, as measured by the near-end microphone 21), to achieve an improved signal-to-noise ratio (SNR) or perceived loudness. For example, a user talking on a phone that incorporates the system 450 at a noisy location where lots of people are talking, in order for the user to better hear received audio from the far-end talker, the RVE module 458 may boost (apply additional gain) to the speech frequencies of the received far-end audio signal that comes through the digital audio stream 22. In other words, RVE module 458 intelligently amplifies the frequencies at which the ambient noise is generally occurring in the incoming audio signal from the audio stream 22 so that those frequencies can be better heard over the ambient noise affecting the system 450. As another example, if the user is using the system 450 in a subway station, the surrounding ambient noise may have more low frequency. Thus, the RVE module 458 may boost the low-frequency region of the incoming audio signal to make it heard more easily from the speaker 18, over the ambient low frequency noise from the subway.

If the speaker 18 cannot adequately reproduce bass due to its lack of low frequency response, the perceived near-end noise may be louder than usual. When the RVE module 458 kicks in and applies additional gain to these low frequencies, this may result in distortions due to the more aggressive gain applied. This may also result in distortions due to the more aggressive gains applied in each frequency bin of the incoming audio signal of the audio stream 22. In addition, using RVE with small speakers having limited low-frequency response may also cause distortion due to pushing the speakers too hard with overly aggressive gains across the audio frequencies.

When the speaker 18 is not adequate to reproduce low frequency sound, the PBE module 454 can improve the perceived bass of the audio playback path, enhancing the masking effect for ambient noise. This can result in less aggressive gain settings of the RVE module 458, and thus, reduction of audio distortion caused by RVE. RVE's tuning parameters, outputs, together with ANC module outputs, audio post-processing module outputs and the speaker parameters 108, can be combined to tune the PBE module 454 in real-time. Given this integration, ideal full-range speakers can be used to tune the RVE module 458 at optimum prior to operation, and then the system 450 can adapt to different audio signal contents and speaker types during operation. PBE is used dynamically to shift low-frequency reproduction burden into higher frequency region(s), when it is needed.

The low-frequency bass boost added by the RVE module 458 can be determined by the PBE parameter control module 456 according to the RVE tuning parameters and the detected ambient noise signal condition, as measured by either or both of the microphones 20-21. By knowing how much additional bass production burden is added to the speaker 18 by the RVE module 458, the PBE parameter control module 456 can decide to add more or less virtual bass by adjusting the PBE parameters. For example, the PBE parameters that can be adjusted include the bass cutoff frequency and the PBE internal dynamic range parameters. The nature of the ambient noise characteristics detected by RVE module 458 can also determine how sharp the filter roll-offs should be within PBE module 454. The filter roll-offs can be adjusted by changing the filter orders.

In an example operational scenario of the system 450, the RVE module 458 estimates near-end ambient noise using a signal from the reference microphone 20 or near-end microphone 21. If the ANC anti-noise signal and audio signal bass contents overload the speaker 18, the speaker output becomes distorted, and thus, the RVE output signal will become inaccurate, which when further processed by the system 450 and output through the speaker 18, feeds back into the reference microphones 20, 21 and leads to non-optimum RVE module performance. The problem can be resolved, at least in part, by the dynamic tuning of PBE module 454.

The ANC and RVE modules 454, 458 and other module parameters may be tuned based on actual, non-ideal speakers used in the system 450. This can be accomplished by first tuning parameters of ANC and RVE modules and/or other modules using ideal speaker parameters. Then the real speakers' profile (frequency response, polar pattern, and the like) are used to control the PBE module parameters, EQ components of the audio post-processing module 110 to achieve the desired the bass performance without overloading and distorting the real speaker. The actually non-ideal speaker, sometimes a small speaker on mobile device, will often have high cutoff response curve compared to an ideal full-range speaker. By storing the actual speaker profile (as the speaker parameters 108), the system 450 can adjust the PBE, audio post-processing, and/or RVE module 454, 110, 458 parameters, which are already tuned by default to an ideal speaker. This calibration method is beneficial because by pre-storing the ideal speaker profile, the system 450 has a starting point for the tuning method with an ideal speaker tuning, and can then shift the parameters with the actually speaker profile during use.

Figure 7:
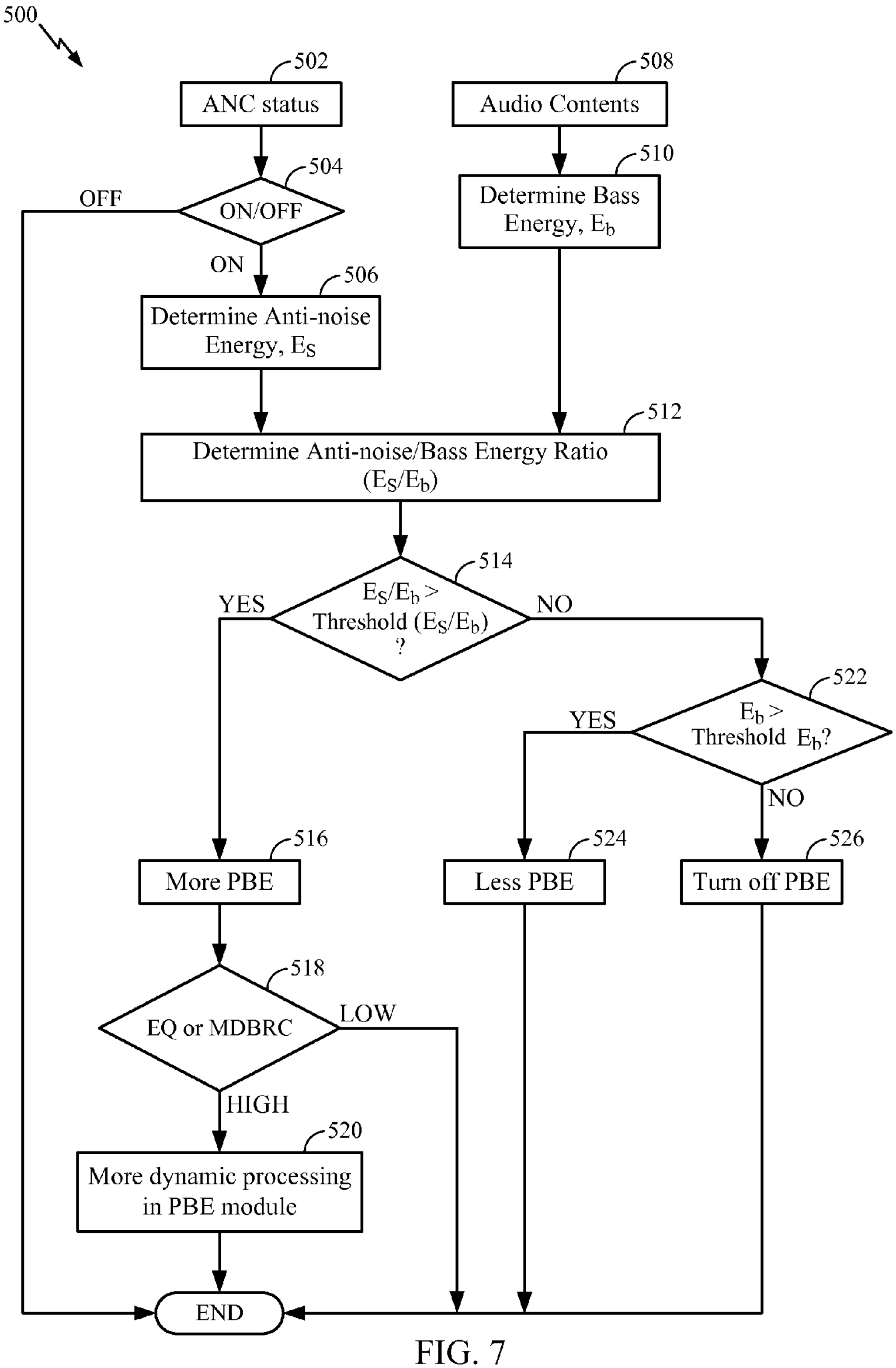
FIG. 7 is a flowchart showing an example method of determining PBE parameters.

FIG. 7 is a flowchart 500 showing an example method of determining PBE parameters. The method may be executed by the PBE parameter control module 106 of FIG. 4, the PBE parameter control module 456 of FIG. 6, or the systems 10 and 25 of FIGS. 1 and 2, respectively.

In step 502, the status of the ANC module is checked. A determination is made whether the ANC module is active (step 504). If the ANC module is off, the method terminates, without any PBE being performed on the audio stream signal. If the ANC module is active (on), a determination of the anti-noise energy level, $E_s$, of the ANC signal is made (step 506). The ANC module generates anti-noise to cancel the background noise. The anti-noise energy level is proportional to the background noise level. Higher anti-noise level indicates higher risk of overloading the speaker. The frequency range can be between 150 Hz and 1500 Hz. The $E_s$ can be the rms energy of the ANC generated anti-noise signal within this frequency band.

In step 508, the audio signal from the audio stream is received and contents of the audio stream are analyzed. In step 510, the bass energy, $E_b$, of the audio signal is determined. The frequency range between 150 Hz and 1500 Hz can be used for the bass energy determination of the audio signal, and the bass energy, $E_b$, can be calculated as the rms energy level of the audio signal in this frequency range.

In step 512, the ratio of the anti-noise energy and the bass energy ($E_s/E_b$) is determined. The $E_s/E_b$ ratio then is compared to a pre-defined threshold value (decision step 514). If the $E_s/E_b$ ratio is greater than the threshold value, more PBE is applied to the audio signal (step 516). This can be accomplished by adjusting the PBE parameters to increase the PBE LPF cutoff frequency so that a greater bandwidth of audio signal is synthesized into virtual bass by the PBE module. Next, the EQ/MBDRC levels of the audio signal are determined (decision step 518). EQ and MBDRC methods may be applied to the audio signal of the audio stream 22 by the audio post-processing module 110, before the audio signal enters the PBE module. These methods rely on EQ and MBDRC parameters, which may be read by the PBE parameter control module. The EQ and MBDRC control parameters are used to shape the envelope and frequency responses of the audio signal. The EQ and MBDRC parameters may also indicate a gain level for each predefined frequency band of the audio signal. For example, higher gain attenuating settings in low frequency bins of MBDRC process indicate that the input audio signal has higher bass level. When those bass frequencies are replaced by PBE virtual bass, the PBE module's internal G&D module has to boost the virtual bass level to maintain a relatively constant perceived output level.

The EQ/MBDRC level(s) is compared to a predefined threshold (step 518). If the level is lower than the threshold, then the method terminates, without any further adjustment to the PBE parameters. However, if the level is at or above the threshold, the PBE parameters are adjusted so that more dynamic processing in the PBE occurs to produce a more constant audio output level (step 520). These adjustments can be accomplished by adjusting the G&D parameters of the PBE module, as discussed above in connection with FIG. 3.

Returning to step 514, if the $E_s/E_b$ ratio is not above the threshold, then the bass energy, $E_b$, is compared to a predefined bass energy threshold (step 522). If the bass energy, $E_b$, is less than the threshold, PBE is not performed on the audio signal and the PBE module may be turned off, at least temporarily (step 526). If $E_b$ is greater than or equal to the threshold, the PBE parameters are adjust to perform less PBE on the audio signal (Step 524). This can be accomplished by adjusting the PBE parameters to decrease the PBE LPF cutoff frequency so that a smaller bandwidth of audio signal is synthesized into virtual bass by the PBE module.

The method depicted in FIG. 7 may be iteratively repeated in real-time to continuously adjust the PBE parameters in real-time based on the output of the ANC module and audio post-processing module. The threshold values described in reference to FIG. 7 may be tuned parameters that are based on the actual speaker(s), i.e., the speaker parameters, used with the system.

Figure 8:
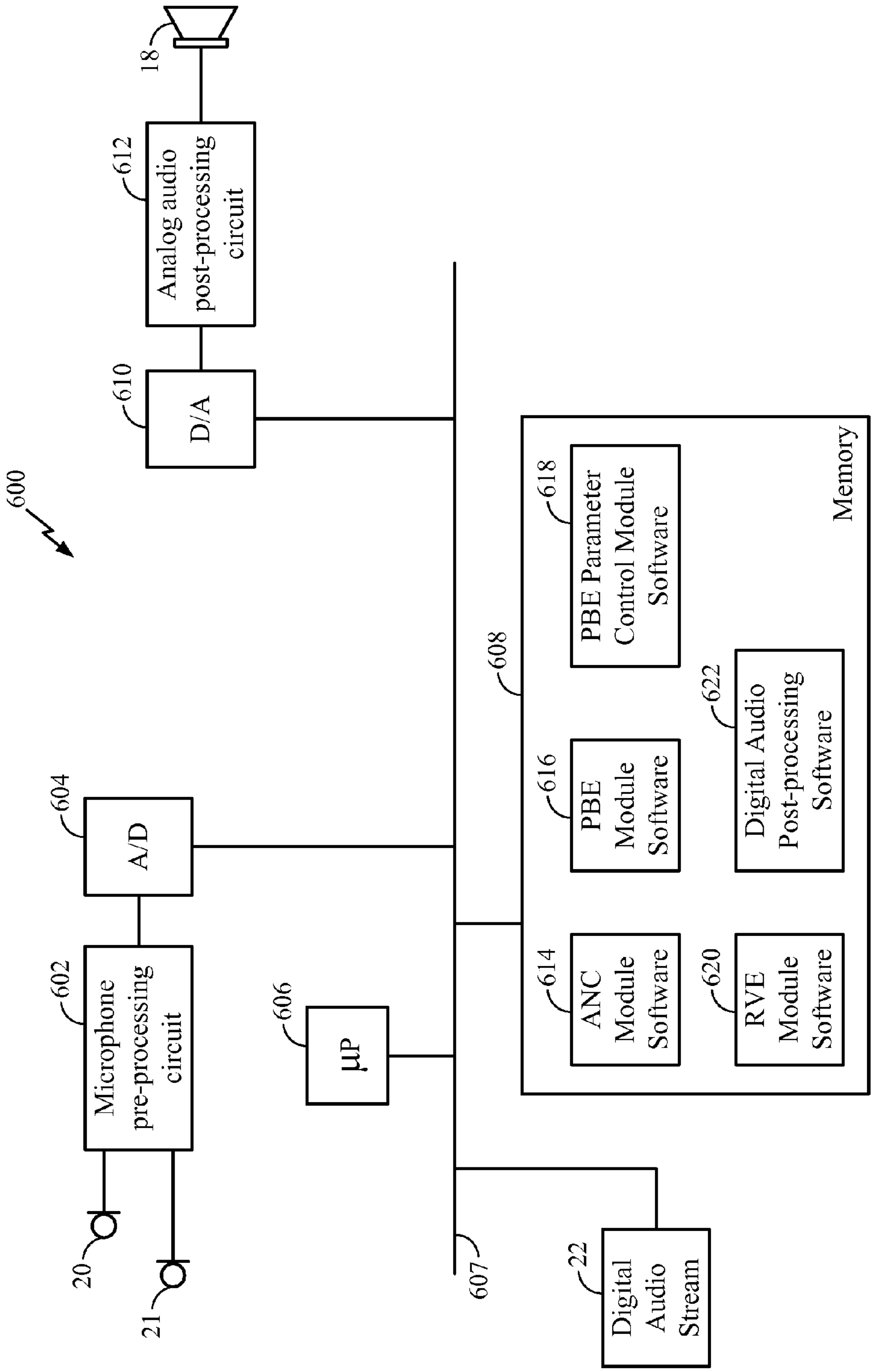
FIG. 8 is block diagram illustrating certain hardware and software components of an exemplary audio system with integrated PBE.

FIG. 8 is block diagram illustrating certain hardware and software components of an exemplary audio system 600 with integrated PBE. The system 600 may be used to implement any of the systems and methods described in connection with FIGS. 1-7. The system 600 includes the microphones 20, 21, a microphone pre-processing circuit 602, an analog-to-digital (A/D) converter 604, a processor (uP) 606, a memory 608, a digital-to-analog (D/A) converter 610, an analog audio post-processing circuit 612, and at least one speaker 18. The uP 606, A/D and D/A converters 604, 610 and memory 608 are coupled together using any suitable means to communicate, such as a bus 607. Although not shown in the figure, other components of the system 600, for example, the pre-processing circuit 602 and post-processing circuit 612, may also be coupled to the bus 607 to communicate with the other system components.

The microphone pre-processing circuit 602 may include any suitable circuitry for analog processing the microphone signals so that they may be appropriately digitized by the A/D converter 604, such as one or more amplifiers, filters, level shifters, echo cancellers, or the like.

The A/D converter 604 can be any suitable A/D converter for converting the pre-processed microphone signals into digital microphone signals. The A/D converter 604 may be a multi-channel A/D converter so that it may simultaneously convert both signals from the microphones 20, 21.

The memory 608 stores programming code and data used by the uP 606. The memory 608 can be any suitable memory device for storing data and programming code (programming instructions), including but not limited to RAM, ROM, EEPROM, optical storage, magnetic storage, or any other medium that can be used to store program code and/or data structures and that can be accessed by the uP 606. The programming code may include ANC module software 614, PBE module software 616, PBE parameter control module software 618, RVE module software 620, and digital audio post-processing software 622.

The ANC module software 614 can include instructions executable by the uP 606 to cause the system 600 to perform the functions of any of the ANC modules described herein in connection with FIGS. 1-7. The PBE module software 616 can include instructions executable by the uP 606 to cause the system 600 to perform the functions of any of the PBE modules described herein in connection with FIGS. 1-7. The PBE parameter control module software 618 can include instructions executable by the uP 606 to cause the system 600 to perform the functions of any of the PBE parameter control modules described herein in connection with FIGS. 4-7. The RVE module software 620 can include instructions executable by the uP 606 to cause the system 600 to perform the functions of any of the RVE modules described herein in connection with FIGS. 6-7. The digital audio post-processing software 622 can include instructions executable by the uP 606 to cause the system 600 to perform the functions of any of the digital audio post-processing modules described herein in connection with FIGS. 4-7.

The uP 606 can execute software and use data stored in the memory 608 to cause the system 600 to perform the functions and methods of any of the systems described herein in connection with FIGS. 1-7. The uP 606 can be a microprocessor, such as an ARM7, digital signal processor (DSP), one or more application specific integrated circuits (ASICs), field programmable gate arrays (FPGAs), complex programmable logic devices (CPLDs), discrete logic, or any suitable combination thereof.

The D/A converter 610 can be any suitable D/A converter for converting the digital audio output signal into an analog audio output signals. In reference to FIGS. 1-7, the digital audio output signal is generally the output of the combiner 16, or in some configurations, the crossover module 23 of FIG. 2. The D/A converter 610 may be a multi-channel D/A converter so that it may simultaneously convert multiple audio output channels, e.g., stereo output, reproduced by the system 650.

The analog post-processing circuit 612 may include any suitable circuitry for analog processing the output audio signals so that they may be appropriately output by the loud speaker 18, such as one or more amplifiers, filters, level shifters, echo cancellers, or the like.

Figure 9:
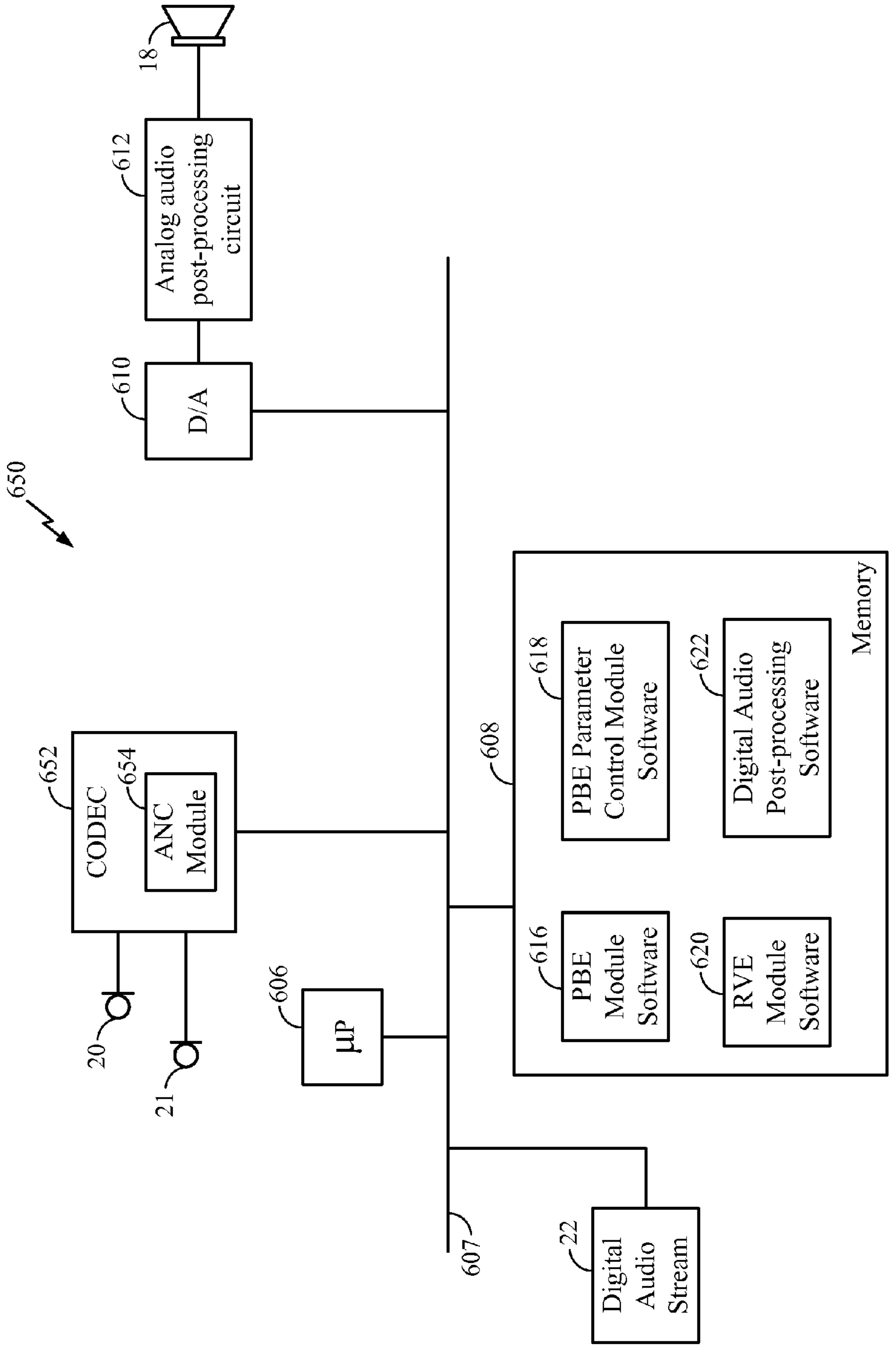
FIG. 9 is block diagram illustrating certain hardware and software components of a second exemplary audio system with integrated PBE.

FIG. 9 is block diagram illustrating certain hardware and software components of a second exemplary audio system 650 with integrated PBE. The system 650 may be used to implement any of the systems and methods described in connection with FIGS. 1-7. In contrast to the system 600 of FIG. 8, the system 650 of FIG. 9 includes a separate codec 652 that includes an ANC module 654, rather than having the ANC module implemented by software executing on the uP 606.

The codec 652 may be a component that includes at least one encoder configured to receive and encode frames of an audio signal (possibly after one or more pre-processing operations, such as a perceptual weighting and/or other filtering operation) and a corresponding decoder configured to produce decoded representations of the frames. Such an encoder and decoder are typically deployed at opposite terminals of a communications link In order to support a full-duplex communication, instances of both of the encoder and the decoder are typically deployed at each end of such a link The codec 652 outputs the ANC signal for processing by the uP 606, and may also output audio, such as voice, which may be combined with the digital audio stream 22 for processing in accordance with the methods and systems described herein.

Although not shown, the codec 652 may include microphone pre-processing circuitry, as described above in connection with FIG. 8. The codec 652 can also provide the digitized microphone signals to the uP 606 for processing by the RVE module and other software.

The system 650 includes the microphones 20, 21, a microphone pre-processing circuit 602, an analog-to-digital (A/D) converter 604, the microprocessor (uP) 606, the memory 608, the digital-to-analog (D/A) converter 610, the analog audio post-processing circuit 612, and at least one speaker 18. The uP 606, A/D and D/A converters 604, 610 and memory 608 are coupled together using any suitable means to communicate, such as a bus 607. Although not shown in the figure, other components of the system 600, for example, the pre-processing circuit 602 and post-processing circuit 612, may also be coupled to the bus 607 to communicate with the other system components.

The memory 608 stores programming code and data used by the uP 606. The programming code may include ANC module software 614, PBE module software 616, PBE parameter control software 618, RVE module software 620, and digital audio post-processing software 622.

The systems disclosed herein can be included in any suitable audio output system, including a computer, gaming console, stereo system, or handheld device such as a cellular phone, personal digital assistant (PDA), smart phone, headset, MP3 player, or the like. The predominate functions of the ANC modules, RVE modules, audio post-processing modules, PBE modules and combiners described herein are generally implemented in the digital processing domain. However, these components may be alternatively implemented in the analog domain using suitable analog components, or any suitable combination of analog and digital electronic components.

The functionality of the systems, devices and their respective components, as well as the method steps and modules described herein may be implemented in hardware, software/firmware executed by hardware, or any suitable combination thereof. The software/firmware may be a program having sets of instructions (e.g., programming code segments) executable by one or more digital circuits, such as microprocessors, DSPs, embedded controllers, or intellectual property (IP) cores. If implemented in software/firmware, the functions may be stored on or transmitted over as instructions or code on one or more computer-readable media. The computer-readable media may include computer storage media. A storage medium may be any available medium that can be accessed by a computer. By way of example, and not limitation, such computer-readable medium can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable medium.

Certain examples of integrated ANC/PBE/RVE/audio post-processing systems have been disclosed. These systems are examples, and the possible integrations are not limited to what is described herein. Moreover, various modifications to these examples are possible, and the principles presented herein may be applied to other systems as well. For example, the principles disclosed herein may be applied to devices such as personal computers, stereo systems, entertainment counsels, video games and the like. In addition, the various components and/or method steps/blocks may be implemented in arrangements other than those specifically disclosed without departing from the scope of the claims.

Accordingly, other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. An apparatus, comprising:

an active noise cancellation (ANC) module; and a psychoacoustic bass enhancement (PBE) module configured to produce a PBE signal based on output from the ANC module.

2. The apparatus of claim 1, wherein the PBE module is configured to produce the PBE signal based on an audio signal and the output from the ANC module.

3. The apparatus of claim 1, further comprising:

a control module configured to adjust one or more PBE parameters of the PBE module based on at least one characteristic of an audio signal and the output from the ANC module.

4. The apparatus of claim 3, wherein the control module is configured to adjust the PBE parameters based on a speaker profile.

5. The apparatus of claim 3, wherein the PBE parameters are selected from the group consisting of a bass cut-off frequency, a crossover filter order, harmonic control parameters, audio dynamics parameters, a non-bass content delay, and any suitable combination of the foregoing.

6. The apparatus of claim 1, further comprising:

a combiner configured to combine the PBE signal and an ANC signal from the ANC module.

7. The apparatus of claim 1, further comprising:

a microphone configured to produce an ambient noise signal;

wherein the ANC module is configured to produce an ANC signal based on the ambient noise signal.

8. The apparatus of claim 1, further comprising:

a receive voice enhancement module (RVE) configured to provide parameters for adjusting the PBE performed by the PBE module.

9. The apparatus of claim 8, further comprising:

a microphone configured to produce an ambient noise signal;

wherein the RVE module is configured to selectively apply gain to one or more frequencies of an audio signal based on the ambient noise signal.

10. A method of processing an audio signal, comprising:

receiving the audio signal; and performing psychoacoustic bass enhancement (PBE) on the audio signal based on output from an active noise cancellation (ANC) module.

11. The method of claim 10, wherein performing PBE includes performing PBE on the audio signal based on content of the audio signal and the output from an active noise cancellation (ANC) module.

12. The method of claim 10, further comprising:

adjusting one or more PBE parameters based on content of the audio signal and the output from the ANC module.

13. The method of claim 12, further comprising adjusting the PBE parameters based on a speaker profile.

14. The method of claim 13, wherein the PBE parameters are selected from the group consisting of a bass cut-off frequency, a crossover filter order, a harmonic control parameter, an audio dynamics parameter, a non-bass content delay, and any suitable combination of the foregoing.

15. The method of claim 10, further comprising:

combining a PBE signal and an ANC signal from the ANC module to produce an output audio signal.

16. The method of claim 10, further comprising:

receiving an ambient noise signal from a microphone; and outputting an ANC signal from the ANC module based on the ambient noise signal.

17. The method of claim 10, further comprising:

adjusting the PBE based on parameters from a receive voice enhancement module (RVE).

18. The method of claim 17, further comprising:

the RVE module receiving an ambient noise signal from a microphone; and the RVE module selectively applying gain to one or more frequencies of the audio signal based on the ambient noise signal.

19. An apparatus, comprising:

means for receiving the audio signal; and means for performing psychoacoustic bass enhancement (PBE) on the audio signal based on output from an active noise cancellation (ANC) module.

20. The apparatus of claim 19, wherein the performing means includes means for producing a PBE signal based on an audio signal and the output from the ANC module.

21. The apparatus of claim 19, further comprising:

means for adjusting one or more PBE parameters based on at least one characteristic of an audio signal and the output from the ANC module.

22. The apparatus of claim 20, wherein the adjusting means includes means for adjusting the PBE parameters based on a speaker profile.

23. The apparatus of claim 20, wherein the PBE parameters are selected from the group consisting of a bass cut-off frequency, a crossover filter order, a harmonic control parameter, an audio dynamics parameter, a non-bass content delay, and any suitable combination of the foregoing.

24. The apparatus of claim 19, further comprising:

means for combining a PBE signal and an ANC signal from the ANC module.

25. The apparatus of claim 19, further comprising:

means for producing an ambient noise signal;

wherein the ANC module is configured to produce an ANC signal based on the ambient noise signal.

26. The apparatus of claim 19, further comprising:

means for providing receive voice enhancement (RVE) parameters for adjusting the PBE.

27. The apparatus of claim 19, further comprising:

means for producing an ambient noise signal; and means for selectively applying gain to one or more frequencies of an audio signal based on the ambient noise signal.

28. A non-transitory computer-readable medium embodying a set of instructions executable by one or more processors, comprising:

programming code for receiving an audio signal; and programming code for performing psychoacoustic bass enhancement (PBE) on the audio signal based on output from an active noise cancellation (ANC) module.

29. The computer-readable medium of claim 28, further comprising programming code for producing a PBE signal based on an audio signal and the output from the ANC module.

30. The computer-readable medium of claim 28, further comprising:

programming code for adjusting one or more PBE parameters based on at least one characteristic of an audio signal and the output from the ANC module.

31. The computer-readable medium of claim 30, further comprising programming code for adjusting the PBE parameters based on a speaker profile.

32. The computer-readable medium of claim 30, wherein the PBE parameters are selected from the group consisting of a bass cut-off frequency, a crossover filter order, a harmonic control parameter, an audio dynamics parameter, a non-bass content delay, and any suitable combination of the foregoing.

33. The computer-readable medium of claim 28, further comprising:

programming code for combining a PBE signal and an ANC signal from the ANC module.

34. The computer-readable medium of claim 28, further comprising:

programming code for producing an ambient noise signal; and programming code for producing an ANC signal based on the ambient noise signal.

35. The computer-readable medium of claim 28, further comprising:

programming code for providing receive voice enhancement (RVE) parameters for adjusting the PBE.

36. The computer-readable medium of claim 28, further comprising:

programming code for producing an ambient noise signal; and programming code for selectively applying gain to one or more frequencies of an audio signal based on the ambient noise signal.

* * * * *